US012795859B2

(12) United States Patent
Chen et al.

(10) Patent No.: US 12,795,859 B2
(45) Date of Patent: Nov. 10, 2026

(54) HEAT SINK

(71) Applicants: COOLER MASTER CO., LTD., Taipei City (TW); NATIONAL YANG MING CHIAO TUNG UNIVERSITY, Hsinchu City (TW)

(72) Inventors: Hao-Jun Chen, Hsinchu City (TW); Chi-Chuan Wang, Taipei City (TW)

(73) Assignees: COOLER MASTER CO., LTD., Taipei City (TW); NATIONAL YANG MING CHIAO TUNG UNIVERSITY, Hsinchu City (TW)

( * ) Notice: Subject to any disclaimer, the term of this patent is extended or adjusted under 35 U.S.C. 154(b) by 119 days.

(21) Appl. No.: 18/792,330

(22) Filed: Aug. 1, 2024

(65) Prior Publication Data

US 2025/0142780 A1 May 1, 2025

(30) Foreign Application Priority Data

Oct. 30, 2023 (TW) ................................ 112141530

(51) Int. Cl.
*H05K 7/20* (2006.01)

(52) U.S. Cl.
CPC .................................. *H05K 7/2039* (2013.01)

(58) Field of Classification Search
CPC ............................... H05K 7/2039; F28F 13/00
USPC ......................................................... 165/80.3
See application file for complete search history.

(56) References Cited

U.S. PATENT DOCUMENTS

| | | | | |
|---|---|---|---|---|
| 5,694,295 A * | 12/1997 | Mochizuki | F28D 15/0233 174/15.2 |
| 5,957,194 A * | 9/1999 | Azar | F28F 13/06 257/722 |
| 6,556,443 B1 * | 4/2003 | Wei | H10W 40/641 257/706 |
| 6,577,504 B1 * | 6/2003 | Lofland | H10W 40/226 174/16.3 |
| 6,591,897 B1 * | 7/2003 | Bhatti | F28F 3/022 257/E23.105 |
| 6,789,610 B1 * | 9/2004 | Hegde | H10W 40/43 165/80.4 |
| 6,827,130 B2 * | 12/2004 | Larson | H10W 40/226 257/722 |
| 7,149,083 B2 * | 12/2006 | Hsu | F28D 15/0275 257/722 |
| 7,284,596 B2 * | 10/2007 | Larson | H10W 40/226 257/E23.103 |

(Continued)

*Primary Examiner* — Claire E Rojohn, III
(74) *Attorney, Agent, or Firm* — Maschoff Brennan

(57) ABSTRACT

A heat sink includes a thermally conductive base. The thermally conductive base has a first surface, a second surface, a guiding surface and an accommodating recess. The second surface faces away from the first surface. The guiding surface are connected to the first surface and the second surface. The guiding surface is not perpendicular to the first surface and the second surface. The accommodating recess is located at the first surface. The thermally conductive base has an inner bottom surface and an inner annular side surface which surround and form the accommodating recess. The inner annular side surface is connected to the inner bottom surface. The accommodating recess accommodates a heat source. The inner bottom surface is thermally coupled to the heat source.

10 Claims, 5 Drawing Sheets

(56) References Cited

U.S. PATENT DOCUMENTS 7,535,714 B1 * 5/2009 Sinha .................... H10W 40/22 257/713
7,677,052 B2 * 3/2010 Shah ....................... F28D 15/02 62/259.2
D618,629 S * 6/2010 Blumenfeld ................. D13/179
8,020,608 B2 * 9/2011 Delano ................. F04D 29/541 D13/179
8,952,582 B2 * 2/2015 Le Besnerais ........... H02K 9/02 310/55
9,459,056 B2 * 10/2016 Cherian .............. F28D 15/0275
10,415,895 B2 * 9/2019 Onda .................... F28F 21/084
10,598,442 B2 * 3/2020 Liu ..................... F28D 15/0233
11,355,411 B2 * 6/2022 Sakakibara ........ H05K 7/20445
11,892,246 B2 * 2/2024 Ohga .................. F28D 15/0233
2001/0047858 A1 * 12/2001 McCullough ....... H10W 40/226 257/E23.09
2001/0050164 A1 * 12/2001 Wagner ............... F28D 15/0233 165/185
2002/0121365 A1 * 9/2002 Kozyra ................... F28F 3/025 174/16.3
2002/0195229 A1 * 12/2002 Hsieh ........................ F28F 3/04 257/722
2003/0029601 A1 * 2/2003 Johnson .............. H10W 40/226 165/185
2003/0051868 A1 * 3/2003 Dishongh ............... F28D 15/00 165/185
2004/0108104 A1 * 6/2004 Luo ......................... F28F 13/00 165/181
2004/0112585 A1 * 6/2004 Goodson ............... F04B 19/006 165/80.4
2004/0165355 A1 * 8/2004 Chen ..................... H10W 40/28 165/80.4
2005/0022975 A1 * 2/2005 Rosenfeld ............. B22F 3/1103 165/104.11
2005/0042897 A1 * 2/2005 Zhang .................... H01R 12/88 439/71
2007/0139890 A1 * 6/2007 Huang ................ H10W 40/611 257/E23.084
2008/0000892 A1 * 1/2008 Hirano ............... G01N 21/6452 219/433
2008/0011451 A1 * 1/2008 Wang .................... H10W 40/22 257/E23.102
2008/0165497 A1 * 7/2008 Gallina ................. H10W 40/22 257/E23.102
2008/0302508 A1 * 12/2008 Lin ........................... F28F 3/02 165/80.3
2010/0065249 A1 * 3/2010 Liu ..................... F28D 15/0266 361/702
2011/0013402 A1 * 1/2011 Little, Jr. ................ F21V 29/83 313/45
2015/0077931 A1 * 3/2015 Cox ........................ G06F 1/181 361/679.02
2015/0342091 A1 * 11/2015 Scharinger ......... H05K 7/20418 165/80.3
2020/0120790 A1 * 4/2020 Wu ...................... H05K 1/0209
2020/0183469 A1 * 6/2020 Wang ................. H05K 7/20336
2020/0411408 A1 * 12/2020 Walczyk ................. F28F 13/00
2022/0120509 A1 * 4/2022 Takeda ................ F28D 15/0233
2022/0141994 A1 * 5/2022 Lin .................... H05K 7/20154 361/697
2022/0293488 A1 * 9/2022 Chu ...................... H10W 40/22
2022/0346269 A1 * 10/2022 Wang ................. H05K 7/20218
2023/0247755 A1 * 8/2023 Chuang ................... G06F 1/181 361/700
2025/0142780 A1 * 5/2025 Chen .................... H05K 7/2039
2025/0311166 A1 * 10/2025 Yang ......................... G06F 1/20

* cited by examiner

HEAT SINK

CROSS-REFERENCE TO RELATED APPLICATIONS

This non-provisional application claims priority under 35 U.S.C. § 119(a) on Patent Application No(s). 112141530 filed in ROC, on Oct. 30, 2023, the entire contents of which are hereby incorporated by reference.

TECHNICAL FIELD

The present disclosure relates to a heat sink, more particularly to a heat sink having a guiding surface.

BACKGROUND

With rapid development of technology, computation performances of various electronic components have also improved significantly, while a large amount of heat has been generated at the same time. The electronic components may be damaged easily during operating due to high temperature, thereby affecting the reliability thereof. Thus, heat dissipation devices are generally provided to dissipate heat generated by the electronic components, so that the electronic components can operate within an adequate temperature range.

For example, the electronic components can be cooled by a spray cooling system to maintain the performance and lifespan thereof. The so-called "spray cooling system" is to spray coolant on a heat source via high pressure nozzles so as to cool the heat source. At this moment, the coolant may flow vertically along a cooling device of the spray cooling system to form a falling film cooling. However, the cooling device of conventional spray cooling system is attached to one side of the heat source merely, which is insufficient to dissipate heat generated by the heat source, thereby causing the heat source to overheat. In addition, when the coolant from the conventional spray cooling system flows vertically and hits the cooling device, the coolant may splash outward, such that the coolant is unable to sufficiently perform heat exchange with the cooling device, thereby reducing the cooling efficiency. Therefore, how to improve the heat dissipation efficiency of heat sink is one of the problems required to be addressed.

SUMMARY

The present disclosure provides a heat sink with desired heat dissipation efficiency.

One embodiment of the present disclosure provides a heat sink including a thermally conductive base. The thermally conductive base has a first surface, a second surface, a guiding surface and an accommodating recess. The second surface faces away from the first surface. Two opposite sides of the guiding surface are connected to the first surface and the second surface, respectively. The guiding surface is not perpendicular to the first surface and the second surface. The accommodating recess is located at the first surface. The thermally conductive base has an inner bottom surface and an inner annular side surface which surround and form the accommodating recess. The inner annular side surface is connected to a periphery of the inner bottom surface. The accommodating recess is configured to accommodate the heat source. The inner bottom surface is configured to be thermally coupled to the heat source.

According to the heat sink as described in the above embodiments, the thermally conductive base of the heat sink covers the heat source, and the heat sink has the guiding surface, such that the guiding surface can guide the coolant flowing as the wall surface flow to pass by the second surface of the heat sink to dissipate heat generated by the heat source effectively. In addition, the guiding surface can reduce a possibility that the coolant splashes outward due to hitting the heat sink, such that the coolant can sufficiently perform heat exchange with the heat sink. Accordingly, the heat dissipation efficiency of the heat sink can be improved.

BRIEF DESCRIPTION OF THE DRAWINGS

The present disclosure will become more fully understood from the detailed description given hereinbelow and the accompanying drawings which are given by way of illustration only and thus are not limitative of the present disclosure and wherein.

DETAILED DESCRIPTION

Figure 1:
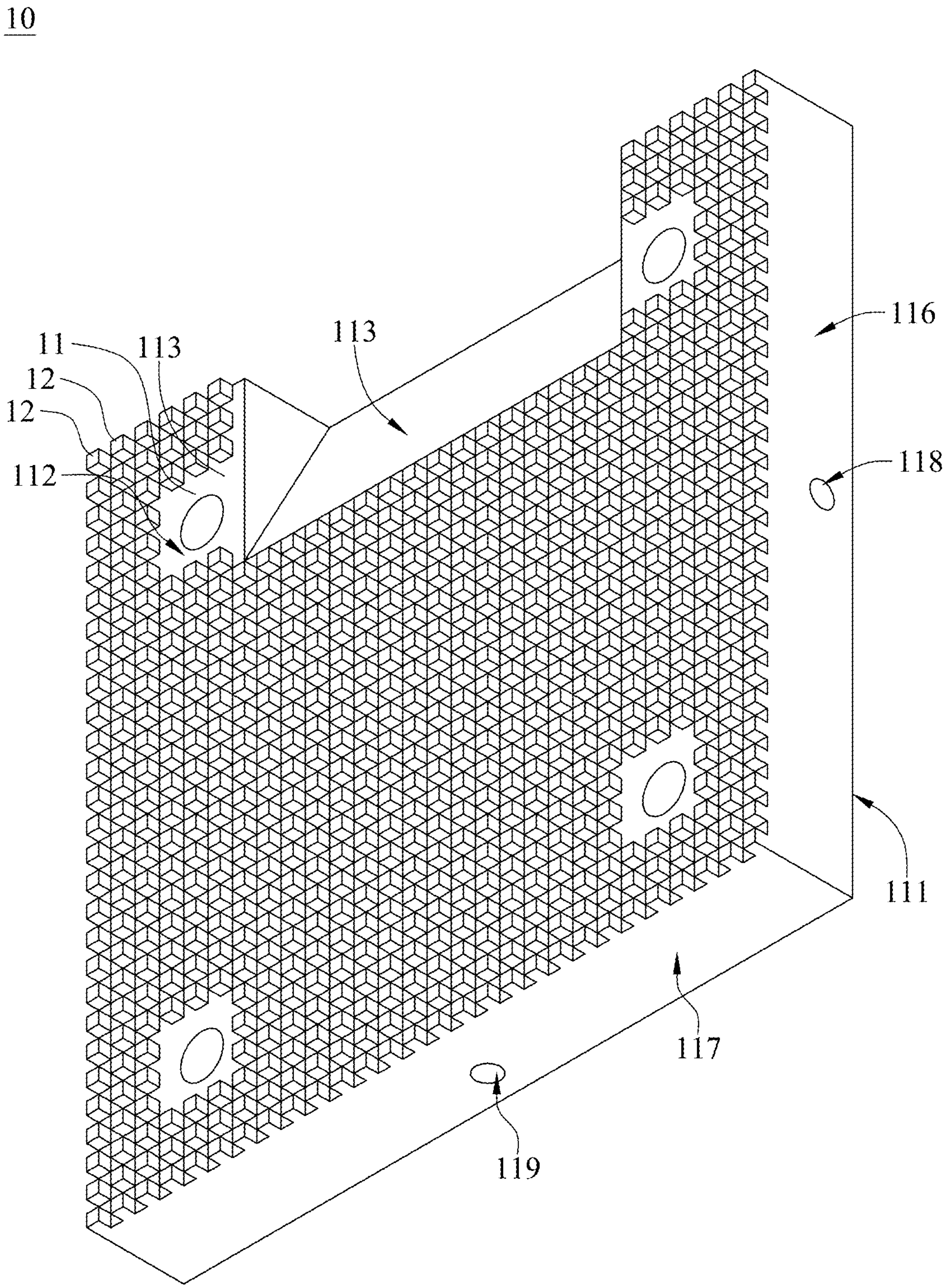
FIG. 1 is a perspective view of a heat sink in accordance with an embodiment of the present disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

In addition, the terms used in the present disclosure, such as technical and scientific terms, have its own meanings and can be comprehended by those skilled in the art, unless the terms are additionally defined in the present disclosure. That is, the terms used in the following paragraphs should be read on the meaning commonly used in the related fields and will not be overly explained, unless the terms have a specific meaning in the present disclosure.

Figure 2:
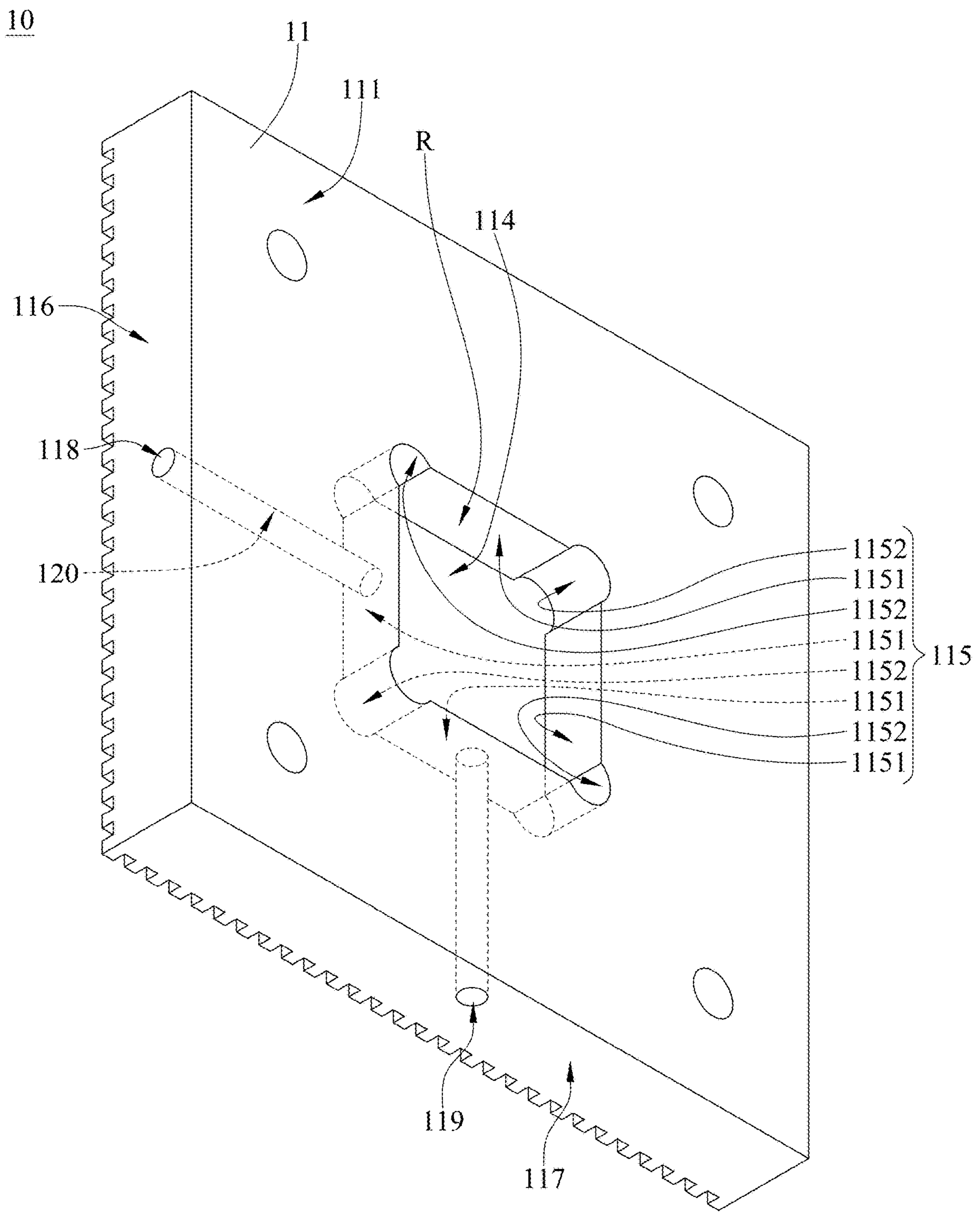
FIG. 2 is another perspective view of the heat sink in FIG. 1.

Please refer to FIG. 1 and FIG. 2, where FIG. 1 is a perspective view of a heat sink 10 in accordance with an embodiment of the present disclosure, and FIG. 2 is another perspective view of the heat sink 10 in FIG. 1.

In this embodiment, a heat sink 10 is, for example, an upright heat sink, and the heat sink 10 is, for example, suitable for a spray cooling system. The heat sink 10 is disposed on, for example, an upright circuit board in a server (not shown), and is configured to be thermally coupled to a heat source (not shown) disposed on the circuit board. The heat source is, for example, a chip. Two objects are thermally coupled to each other, which refers that these two objects are in directly thermal contact to each other, or these two objects are connected to each other via other thermally conductive media therebetween. The heat sink 10 includes a thermally conductive base 11 and a plurality of heat dissipation structures 12. The thermally conductive base 11 has a first surface 111, a second surface 112, a guiding surface 113 and an accommodating recess R.

Figure 3:
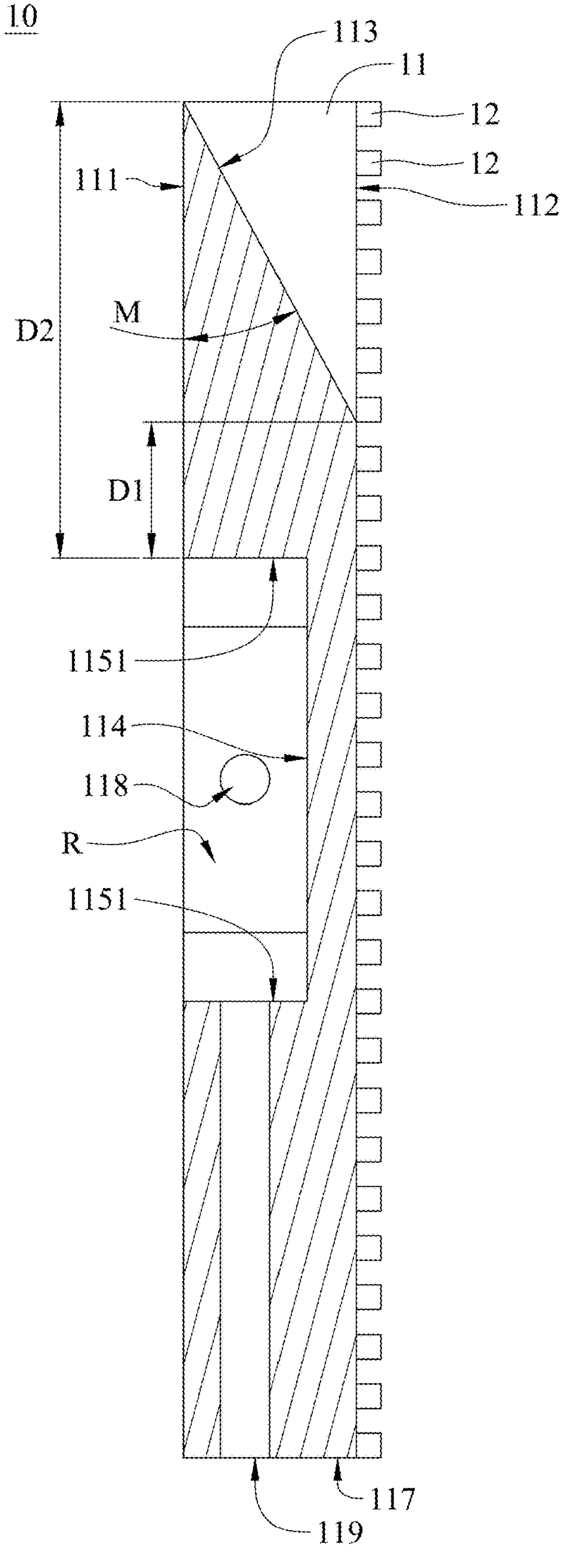
FIG. 3 is a cross-sectional view of the heat sink in FIG. 1.

Please refer to FIG. 1 to FIG. 3, where FIG. 3 is a cross-sectional view of the heat sink 10 in FIG. 1. The second surface 112 faces away from the first surface 111 and the heat source. The guiding surface 113 is, for example, a flat surface, and is configured to guide a coolant (not shown) to flow thereon. The coolant is, for example, a fluorinated liquid. Two opposite sides of the guiding surface 113 are connected to the first surface 111 and the second surface 112, respectively. An angle M between the guiding surface 113 and the first surface 111 is, for example, an acute angle, and the angle M is, for example, greater than 0 degrees, and is smaller than or equal to 45 degrees. For example, the angle M between the guiding surface 113 and the first surface 111 is 28.3 degrees. In addition, the guiding surface 113 is not perpendicular to the second surface 112.

Figure 4:
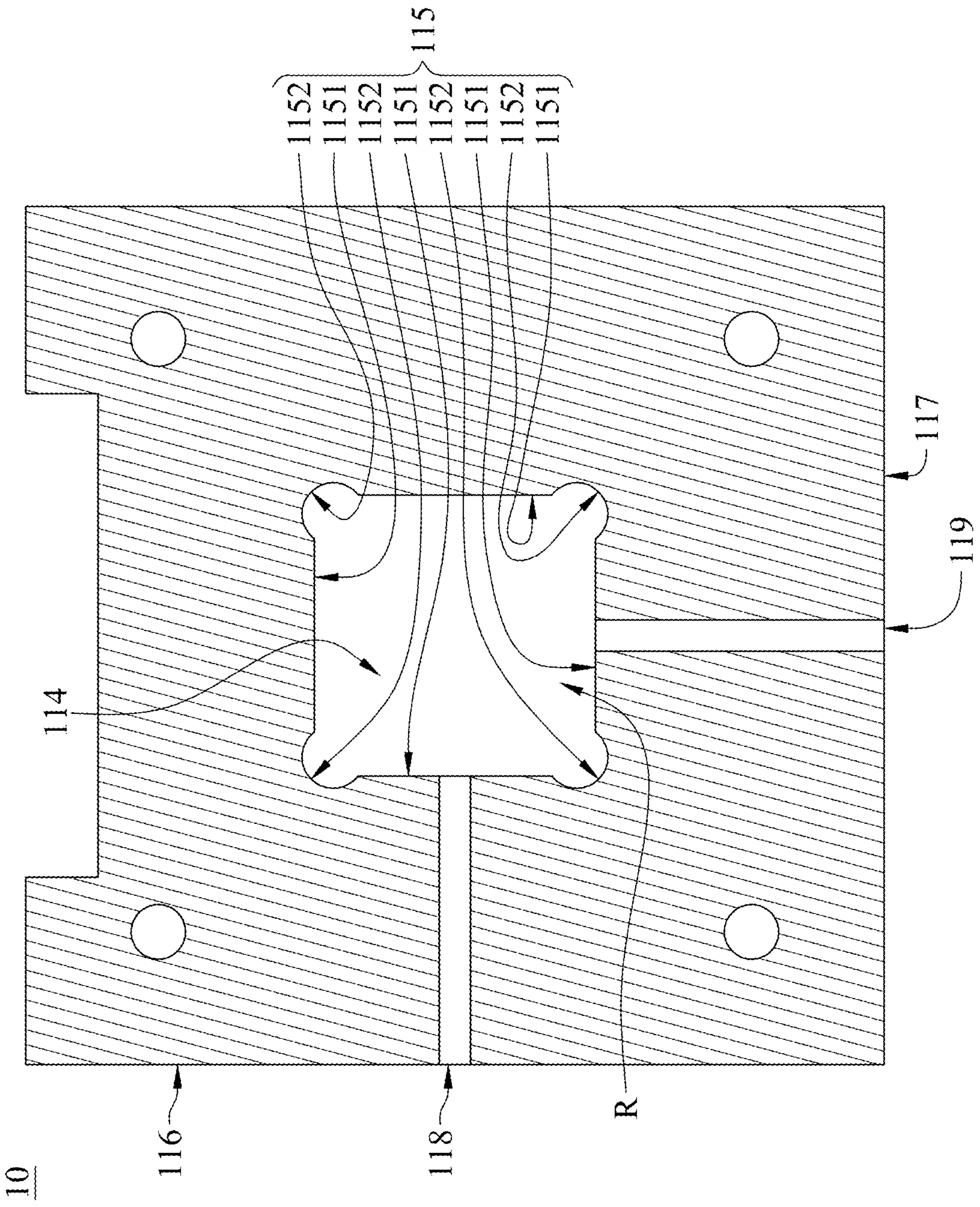
FIG. 4 is another cross-sectional view of the heat sink in FIG. 1.

Please refer to FIG. 1 to FIG. 4, where FIG. 4 is another cross-sectional view of the heat sink 10 in FIG. 1. The accommodating recess R is located at the first surface 111 of the thermally conductive base 11. In detail, the thermally conductive base 11 has an inner bottom surface 114, an inner annular side surface 115 and an annular inner wall surface 120 surrounds and forms the accommodating recess R. The inner annular side surface 115 is connected to a periphery of the inner bottom surface 114. The inner annular side surface 115 has a plurality of flat portions 1151 and a plurality of curved portions 1152. The curved portions 1152 are located at corners of the accommodating recess R, respectively. The flat portions 1151 are connected to the curved portions 1152, respectively, such that the flat portions 1151 and the curved portions 1152 together surround the accommodating recess R.

The accommodating recess R is configured to accommodate the heat source, such that the thermally conductive base 11 covers the heat source. In addition, the inner bottom surface 114 is configured to be thermally coupled to the heat source. The heat dissipation structures 12 are, for example, thermally conductive protrusions, such as rectangular pillars. The heat dissipation structures 12 protrude from the second surface 112 of the thermally conductive base 11, so that heat generated by the heat source can be transferred to the coolant. The guiding surface 113 faces a side of the heat sink 10 including the heat dissipation structures 12, and is inclined toward the side of the heat sink 10 including the heat dissipation structures 12. A distance D1 between a side of the guiding surface 113 close to the heat dissipation structures 12 and the accommodating recess R is less than a distance D2 between a side of the guiding surface 113 away from the heat dissipation structures 12 and the accommodating recess R. Accordingly, the guiding surface 113 can guide the coolant to flow to the second surface 112.

In this embodiment, the coolant flows by the upright heat sink 10 along a wall surface of the circuit board so as to form a wall surface flow. Compared with a conventional upright heat sink, the heat sink does not cover the heat source, such that the wall surface flow does not pass by the second surface of the heat sink. Thus, the heat dissipation efficiency may be reduced. In addition, the heat sink does not have the inclined guiding surface. Thus, when the coolant flows to the heat sink along the wall surface of the circuit board, the coolant may hit the heat sink and splash outward, so that it may cause a waste of the coolant, thereby further reducing the heat dissipation efficiency. In this embodiment, the thermally conductive base 11 of the heat sink 10 covers the heat source, and the heat sink 10 has the guiding surface 113, such that the guiding surface 113 can guide the coolant flowing as the wall surface flow to pass by the second surface 112 of the heat sink 10. In addition, the guiding surface 113 can reduce a possibility that the coolant splashes outward due to hitting the heat sink 10, such that the coolant can sufficiently perform heat exchange with the heat sink 10. Accordingly, the heat dissipation efficiency of the heat sink 10 can be improved.

In this embodiment, the thermally conductive base 11 further has a first side surface 116, a first through hole 118, a second side surface 117 and a second through hole 119. Two opposite sides of the first side surface 116 are connected to the first surface 111 and the second surface 112, respectively. The first side surface 116 and the guiding surface 113 are located at, for example, two adjacent sides of the thermally conductive base 11, respectively. The annular inner wall surface 120 surrounds and forms the first through hole 118. The first through hole 118 is connected to the first side surface 116 and the inner annular side surface 115, and is in fluid communication with the accommodating recess R.

Two opposite sides of the second side surface 117 are connected to the first surface 111 and the second surface 112, respectively. The first side surface 116 and the second side surface 117 are located at different sides of the thermally conductive base 11, respectively. The second side surface 117 and the guiding surface 113, for example, are located at two opposite sides of the thermally conductive base 11, respectively. The second through hole 119 is connected to the second side surface 117 and the inner annular side surface 115.

In this embodiment, the guiding surface 113 is a flat surface, but the present disclosure is not limited thereto. In other embodiments, the guiding surface may be a curved surface.

In this embodiment, the heat dissipation structures 12 are rectangular pillars, but the present disclosure is not limited thereto. In other embodiments, the heat dissipation structures may be cylindrical pillars.

Figure 5:
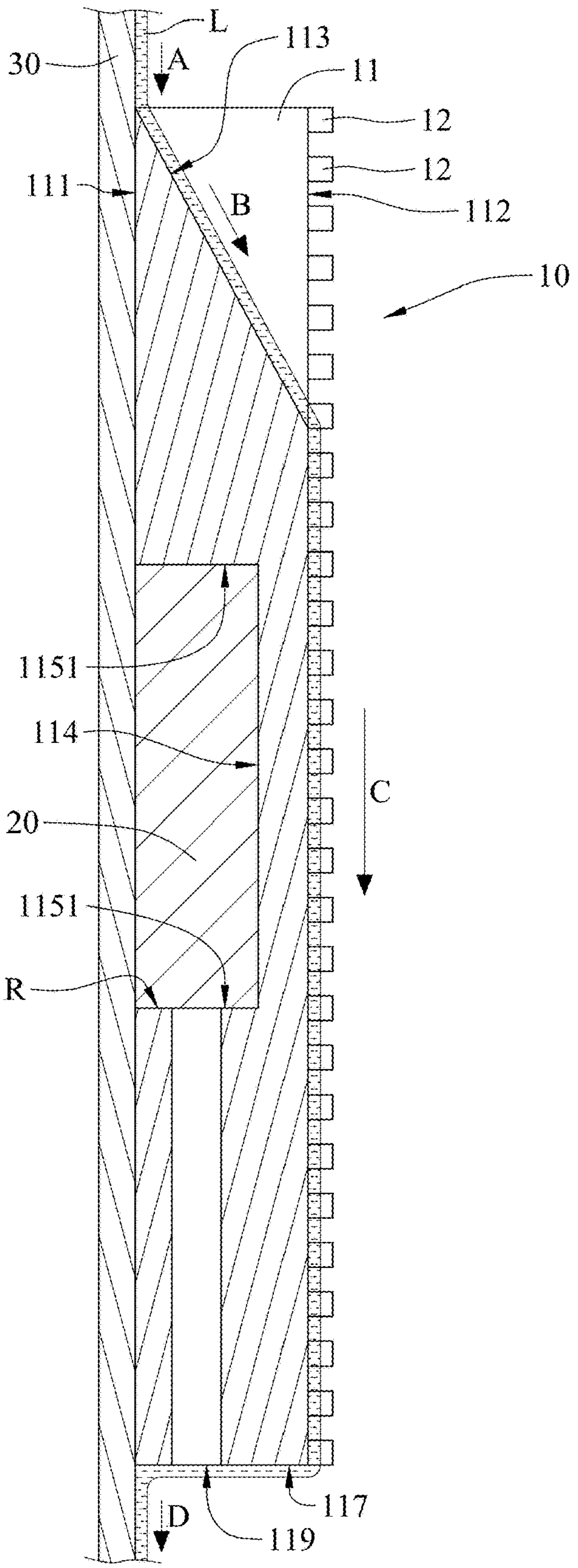
FIG. 5 is a cross-sectional view showing that a coolant passes by the heat sink in FIG. 1.

Please refer to FIG. 5, where FIG. 5 is a cross-sectional view showing that a coolant L passes by the heat sink 10 in FIG. 1. In this embodiment, the heat sink 10 is disposed on the upright circuit board 30. Firstly, the coolant L flows on the wall surface of the circuit board 30 to form the wall surface flow, and flows toward the guiding surface 113 of the thermally conductive base 11 of the heat sink 10 along a direction A. Then, the coolant L flows on the guiding surface 113, and flows toward the second surface 112 of the thermally conductive base 11 of the heat sink 10 along a direction B via the guidance of the guiding surface 113. Then, the coolant L flows on the second surface 112 along a direction C. At this moment, the heat generated by the heat source 20 disposed on the circuit board 30 and located in the accommodating recess R is transferred to the coolant L via the second surface 112 and the heat dissipation structures 12. Then, the coolant L absorbing the heat flows along a direction D and leaves the heat sink 10.

According to the heat sink as described in the above embodiments, the thermally conductive base of the heat sink covers the heat source, and the heat sink has the guiding surface, such that the guiding surface can guide the coolant flowing as the wall surface flow to pass by the second surface of the heat sink to dissipate heat generated by the heat source effectively. In addition, the guiding surface can reduce a possibility that the coolant splashes outward due to hitting the heat sink, such that the coolant can sufficiently perform heat exchange with the heat sink. Accordingly, the heat dissipation efficiency of the heat sink can be improved.

It will be apparent to those skilled in the art that various modifications and variations can be made to the present disclosure. It is intended that the specification and examples be considered as exemplary embodiments only, with a scope of the present disclosure being indicated by the following claims.

What is claimed is:

1. A heat sink, suitable for a spray cooling system and configured to be thermally coupled to a heat source, the heat sink comprising:

a thermally conductive base, having a first surface, a second surface, a guiding surface and an accommodating recess, wherein the second surface faces away from the first surface, two opposite sides of the guiding surface are connected to the first surface and the second surface, respectively, the guiding surface is not perpendicular to the first surface and the second surface, the accommodating recess is located at the first surface, the thermally conductive base has an inner bottom surface and an inner annular side surface which surround and form the accommodating recess, the inner annular side surface is connected to a periphery of the inner bottom surface, the accommodating recess is configured to accommodate the heat source, and the inner bottom surface is configured to be thermally coupled to the heat source;

a plurality of heat dissipation structures, wherein the plurality of heat dissipation structures protrude from the second surface of the thermally conductive base, the guiding surface faces a side of the heat sink comprising the plurality of heat dissipation structures, the guiding surface is inclined toward the side of the heat sink comprising the plurality of heat dissipation structures, and a distance between a side of the guiding surface close to the plurality of heat dissipation structures and the accommodating recess is less than a distance between a side of the guiding surface away from the plurality of heat dissipation structures and the accommodating recess.

2. The heat sink according to claim 1, wherein the plurality of heat dissipation structures are rectangular pillars.

3. The heat sink according to claim 1, wherein the guiding surface is a flat surface, and an angle between the guiding surface and the first surface is an acute angle.

4. The heat sink according to claim 3, wherein the angle between the guiding surface and the first surface is greater than 0 degrees, and is smaller than or equal to 45 degrees.

5. The heat sink according to claim 1, wherein the guiding surface is a curved surface.

6. The heat sink according to claim 1, wherein the inner annular side surface has a plurality of flat portions and a plurality of curved portions, the plurality of curved portions are located at corners of the accommodating recess, respectively, the plurality of flat portions are connected to the plurality of curved portions, respectively, and the plurality of flat portions and the plurality of curved portions together surround the accommodating recess.

7. A heat sink, suitable for a spray cooling system and configured to be thermally coupled to a heat source, the heat sink comprising:

a thermally conductive base, having a first surface, a second surface, a guiding surface, an accommodating recess, a first side surface and a first through hole, wherein the second surface faces away from the first surface, two opposite sides of the guiding surface are connected to the first surface and the second surface, respectively, the guiding surface is not perpendicular to the first surface and the second surface, the accommodating recess is located at the first surface, the thermally conductive base has an inner bottom surface, an inner annular side surface and an annular inner wall surface, the inner annular side surface surrounds and forms the accommodating recess, the inner annular side surface is connected to a periphery of the inner bottom surface, the annular inner wall surface surrounds and forms the first through hole, the accommodating recess is configured to accommodate the heat source, the inner bottom surface is configured to be thermally coupled to the heat source, two opposite sides of the first side surface are connected to the first surface and the second surface, respectively, the first side surface and the guiding surface are located on different sides of the thermally conductive base, respectively, the first through hole is connected to the first side surface and the inner annular side surface, and is in fluid communication with the accommodating recess.

8. The heat sink according to claim 7, wherein the thermally conductive base further has a second side surface and a second through hole, two opposite sides of the second side surface are connected to the first surface and the second surface, respectively, the first side surface, the second side surface and the guiding surface are located on different sides of the thermally conductive base, respectively, and the second through hole is connected to the second side surface and the inner annular side surface.

9. The heat sink according to claim 8, wherein the first side surface and the guiding surface are located on two adjacent sides of the thermally conductive base, respectively.

10. The heat sink according to claim 8, wherein the second side surface and the guiding surface are located on two opposite sides of the thermally conductive base, respectively.

* * * * *